United States Patent [19]
Vafi et al.

[11] Patent Number: 5,474,458
[45] Date of Patent: Dec. 12, 1995

[54] INTERCONNECT CARRIERS HAVING HIGH-DENSITY VERTICAL CONNECTORS AND METHODS FOR MAKING THE SAME

[75] Inventors: Habib Vafi, San Diego; Solomon I. Beilin, San Carlos; Wen-chou V. Wang, Cupertino, all of Calif.

[73] Assignee: Fujitsu Limited, Japan

[21] Appl. No.: 90,701

[22] Filed: Jul. 13, 1993

[51] Int. Cl.⁶ ............................................... H01R 9/09
[52] U.S. Cl. ............................... 439/91; 439/66; 439/74
[58] Field of Search ........................... 439/66, 91, 581, 439/71, 72, 73, 74; 29/830, 842, 883

[56] References Cited

U.S. PATENT DOCUMENTS

| | | | |
|---|---|---|---|
| 3,795,037 | 3/1974 | Luttmer | 29/883 OR |
| 3,982,320 | 9/1976 | Buchoff et al. | 29/883 OR |
| 4,664,309 | 5/1987 | Allen et al. | |
| 4,667,220 | 5/1987 | Lee et al. | |
| 4,743,568 | 5/1988 | Wood | |
| 4,782,381 | 11/1988 | Ruby et al. | |
| 4,783,722 | 11/1988 | Osaki et al. | 439/74 X |
| 4,858,077 | 8/1989 | Shinohara et al. | |
| 4,890,157 | 12/1989 | Wilson | |
| 4,897,918 | 2/1990 | Osaka et al. | 29/840 X |
| 4,954,877 | 9/1990 | Nakanishi et al. | |
| 4,954,878 | 9/1990 | Fox et al. | |
| 5,041,183 | 8/1991 | Nakamura et al. | 439/66 X |
| 5,055,907 | 10/1991 | Jacobs | |
| 5,065,227 | 11/1991 | Frankeny et al. | |
| 5,177,594 | 1/1993 | Chance et al. | |
| 5,217,922 | 6/1993 | Akasaki et al. | 29/840 X |

FOREIGN PATENT DOCUMENTS

0329314A1  8/1989  European Pat. Off. .

Primary Examiner—Larry I. Schwartz
Assistant Examiner—Daniel Wittels
Attorney, Agent, or Firm—Coudert Brothers

[57] ABSTRACT

Interconnect carriers for coupling integrated circuit chips to major substrates and methods for making the same are disclosed. The interconnect carrier comprises a relatively thin resilient supporting layer, a plurality of electrically conductive vias formed through the surfaces of the supporting layer, and an outer frame disposed around the periphery of the supporting layer. The supporting layer preferably comprises an electrically insulating material. The flexibility of the supporting layer enables the layer to more readily conform to the warpages of the IC chip and supporting substrate, while the outer frame provides mechanical support and prevents the supporting layer from folding, twisting, and/or stretching. The thickness of the supporting layer may be substantially reduced over that of prior art interposers to enable methods for constructing smaller diameter vias.

33 Claims, 11 Drawing Sheets

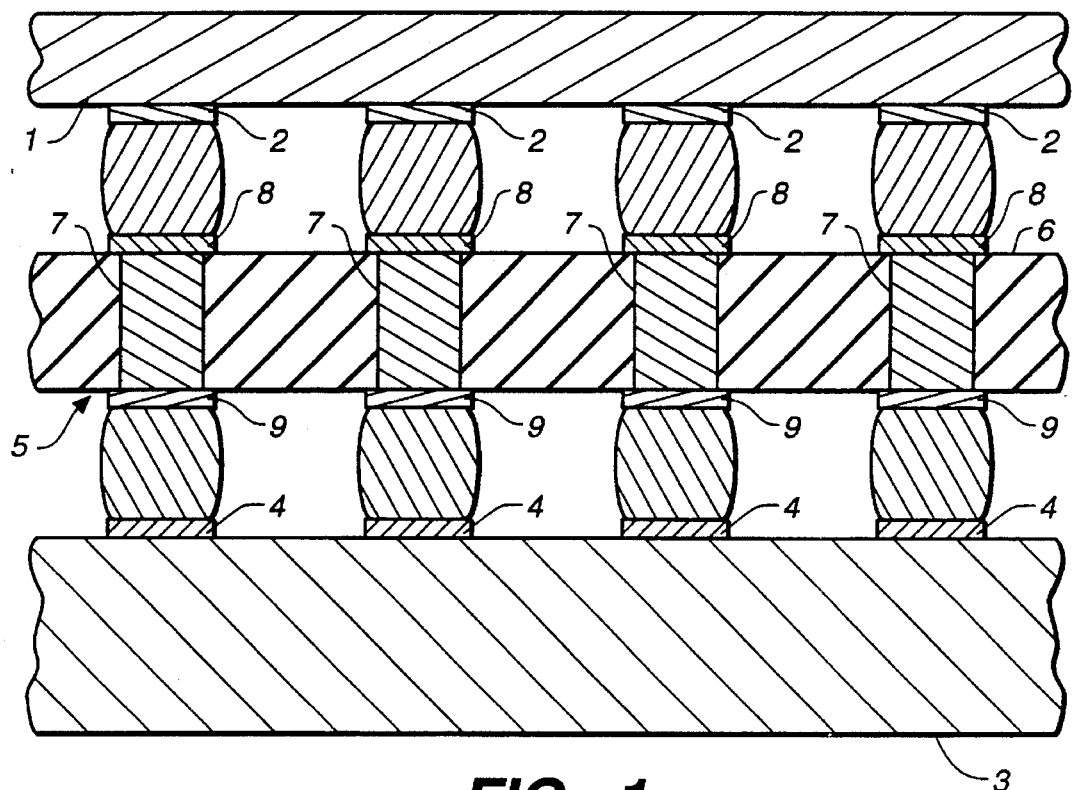
FIG._1
(PRIOR ART)

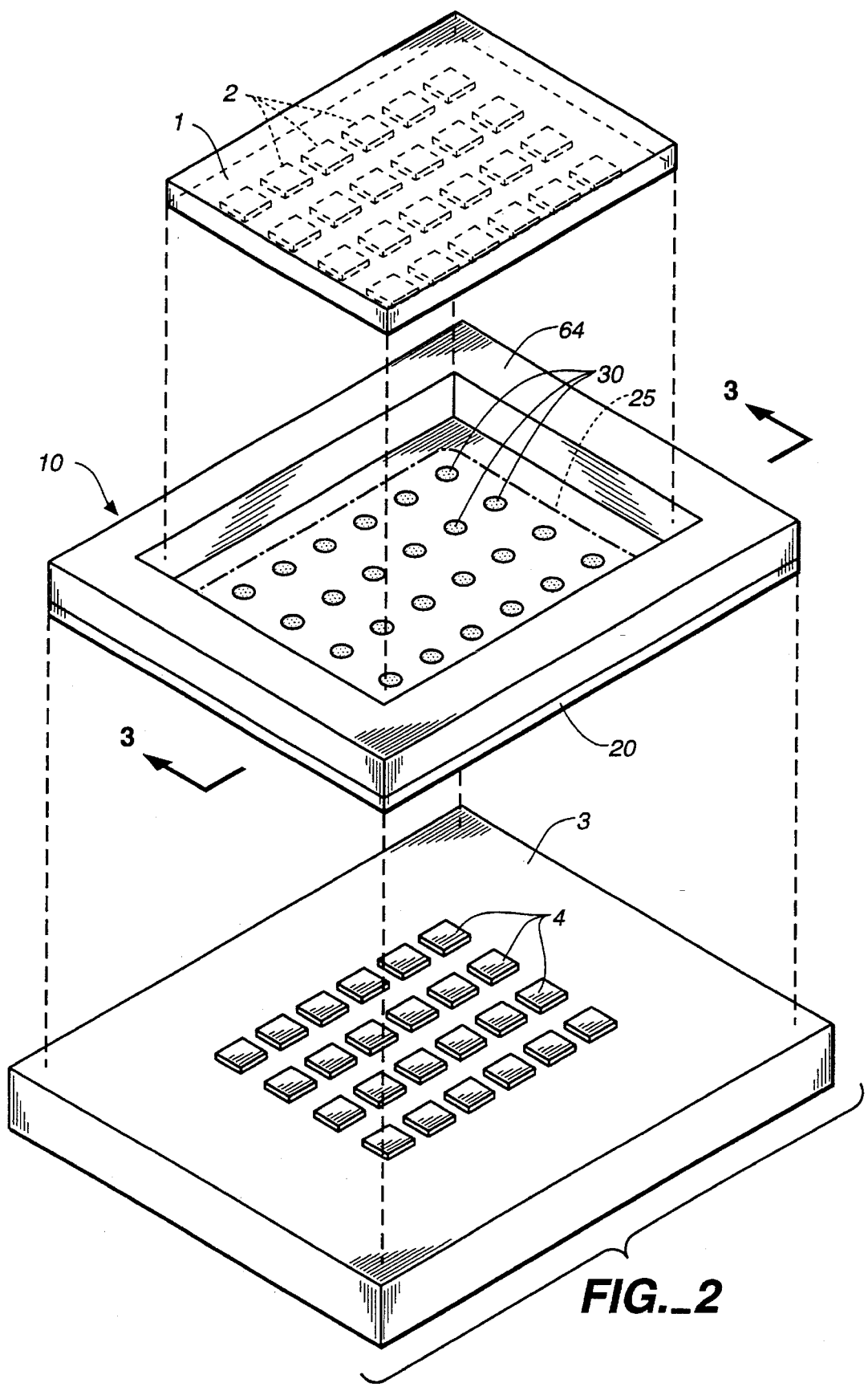
FIG._2

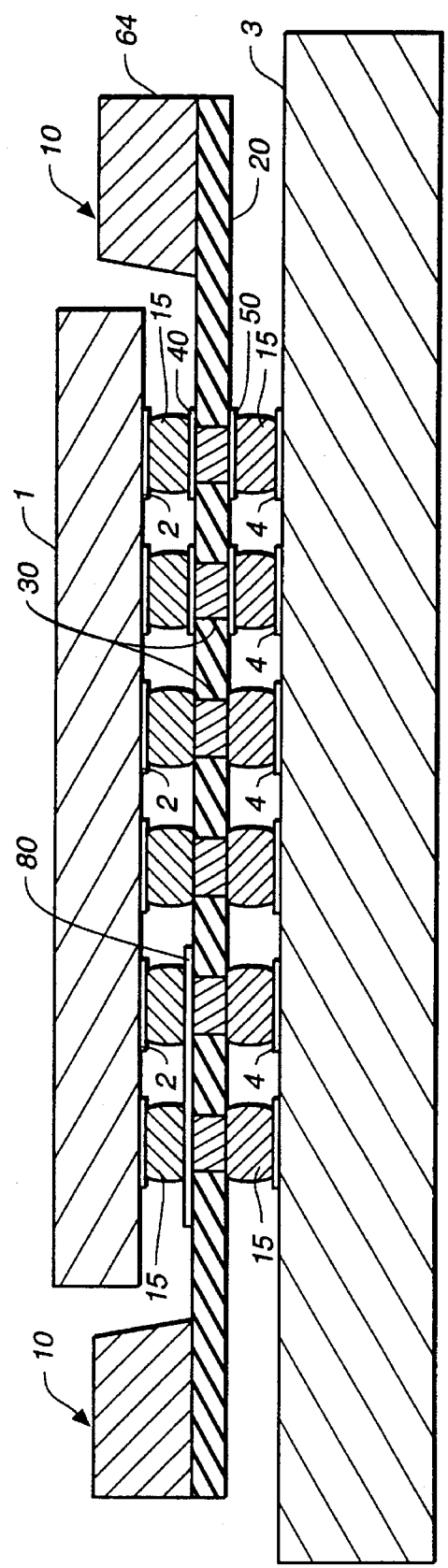
FIG._3

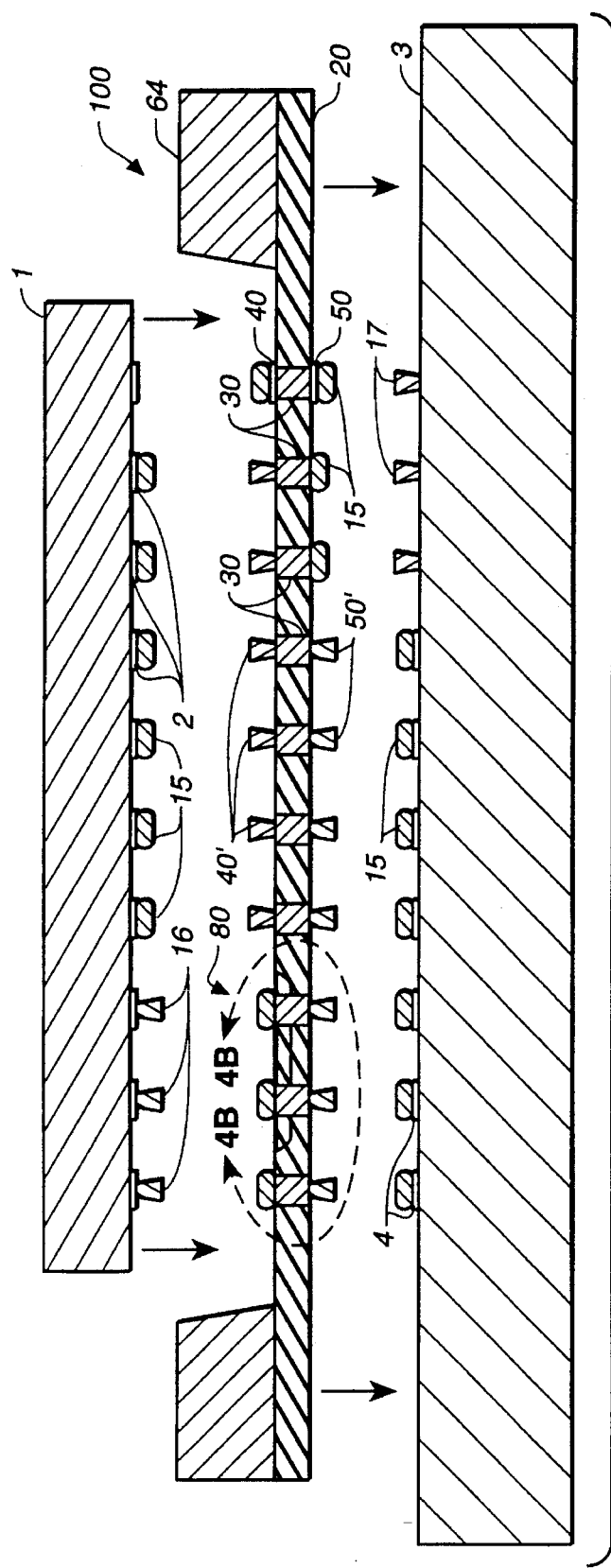
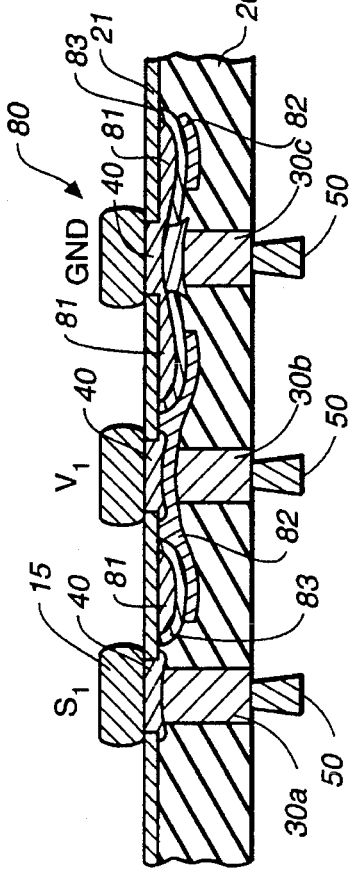
FIG._4A
FIG._4B

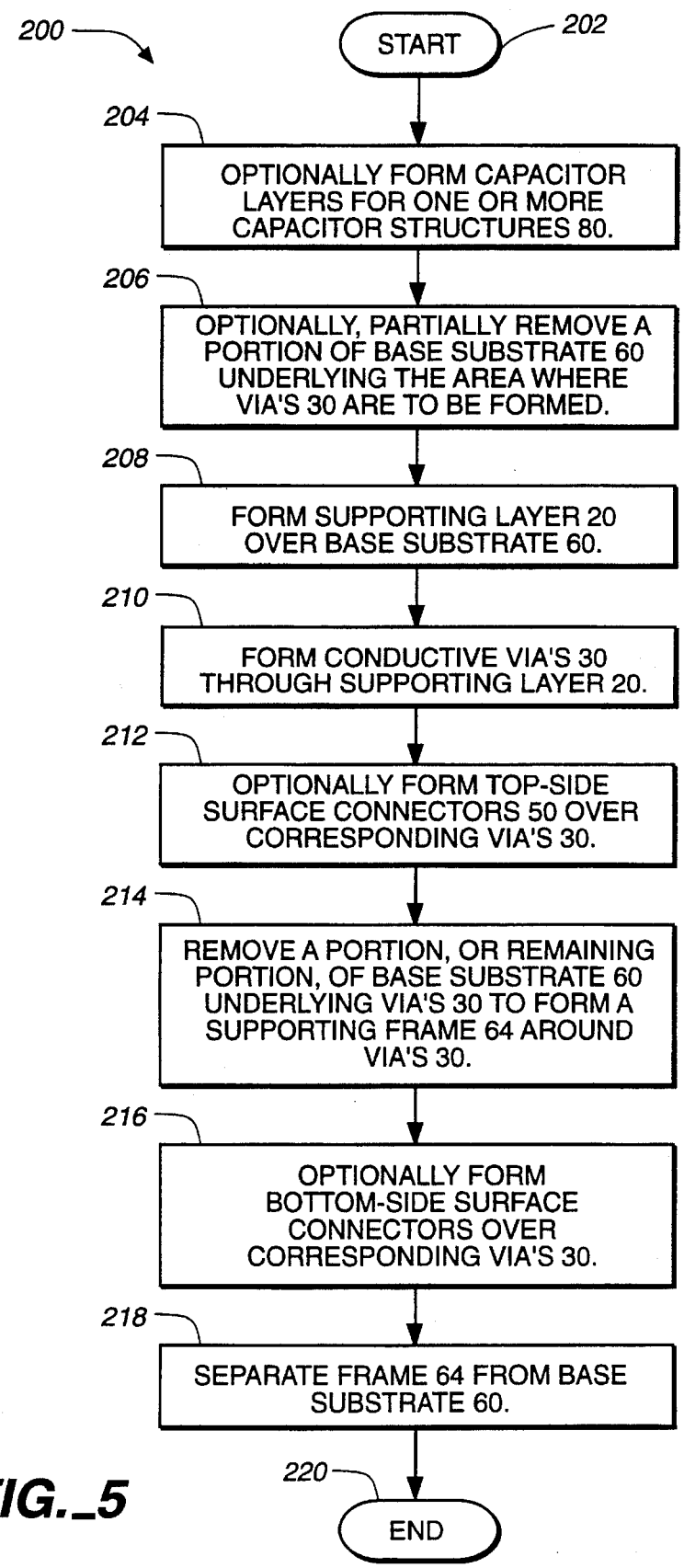
FIG._5

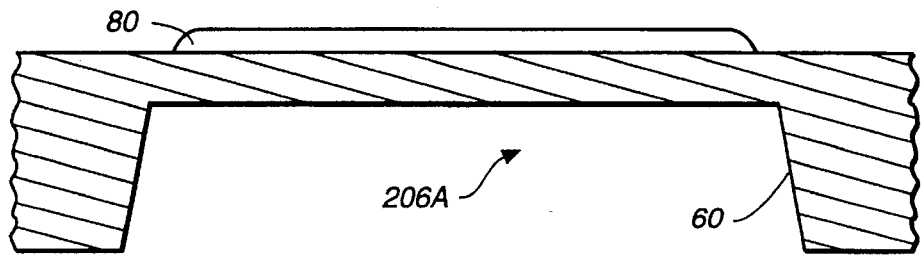
FIG._6A
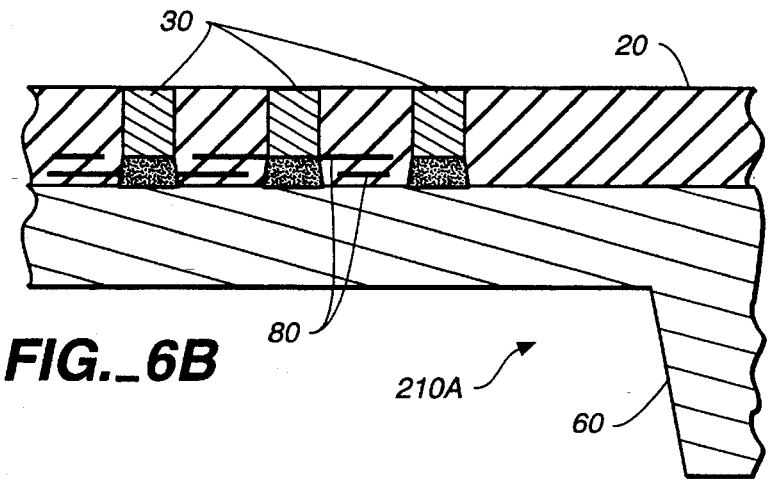
FIG._6B
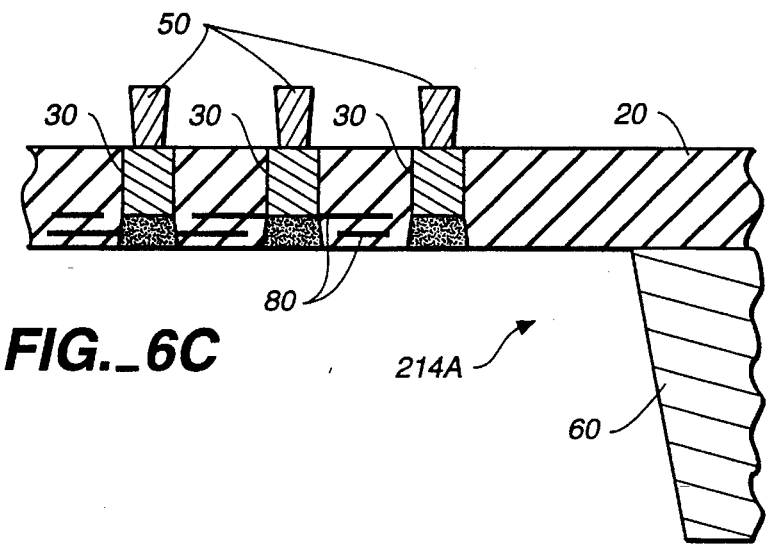
FIG._6C
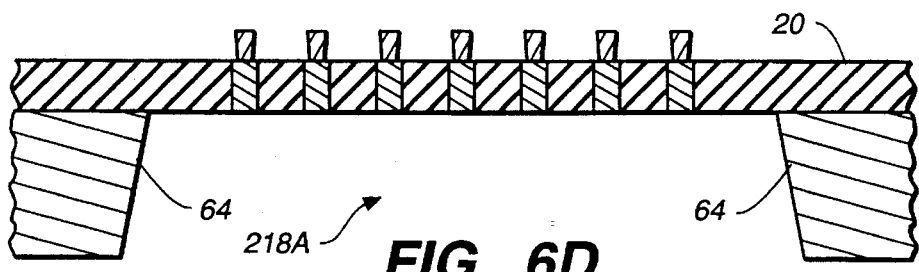
FIG._6D

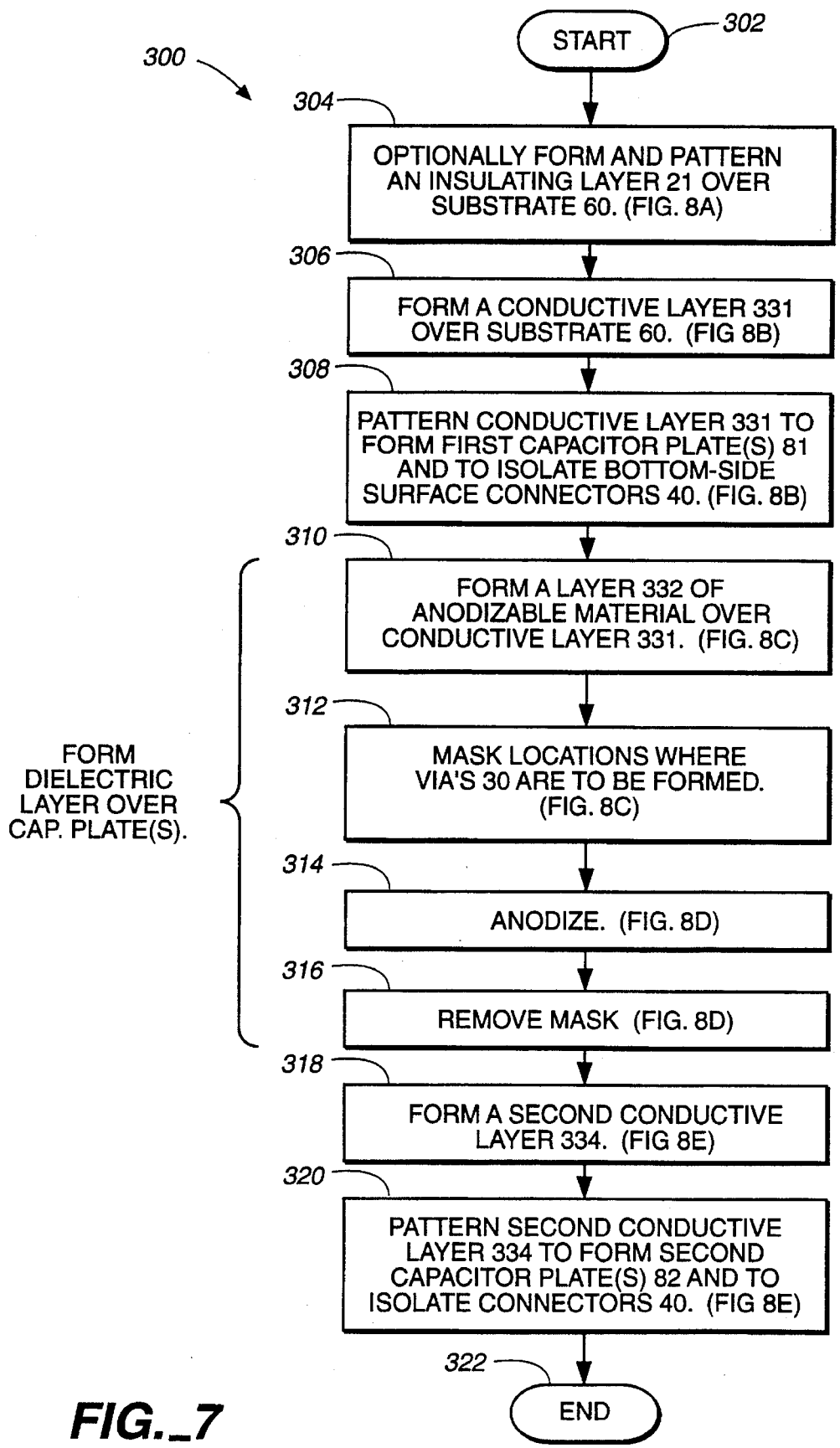
FIG._7

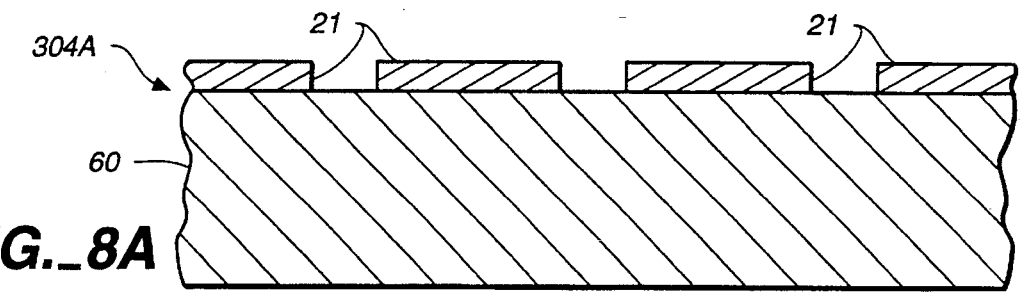
FIG._8A
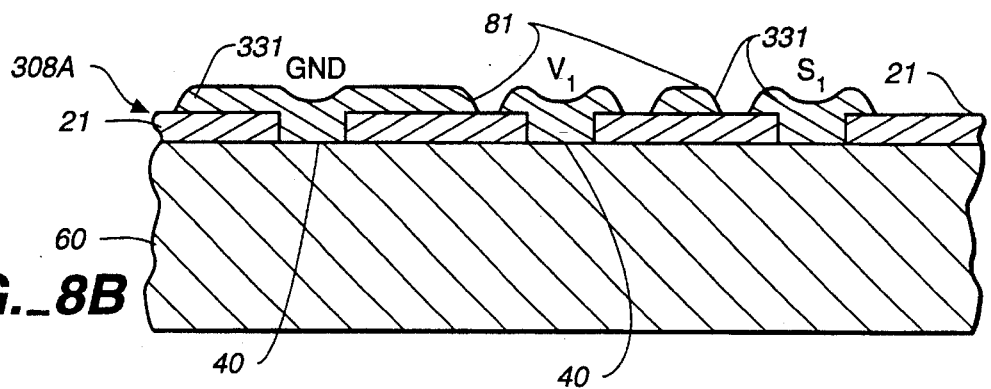
FIG._8B
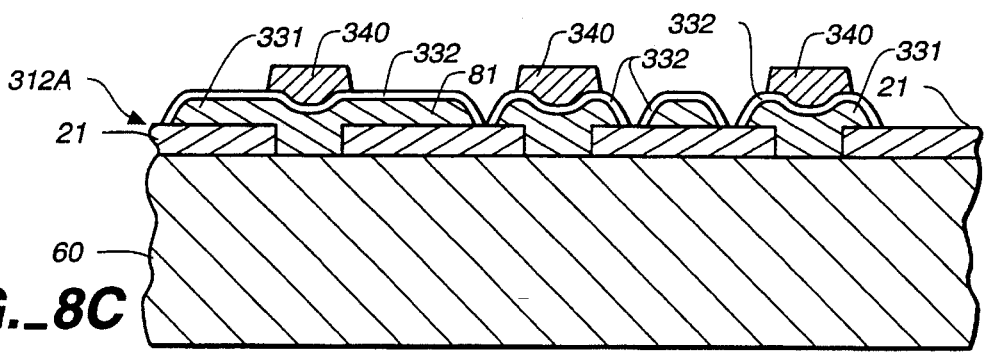
FIG._8C
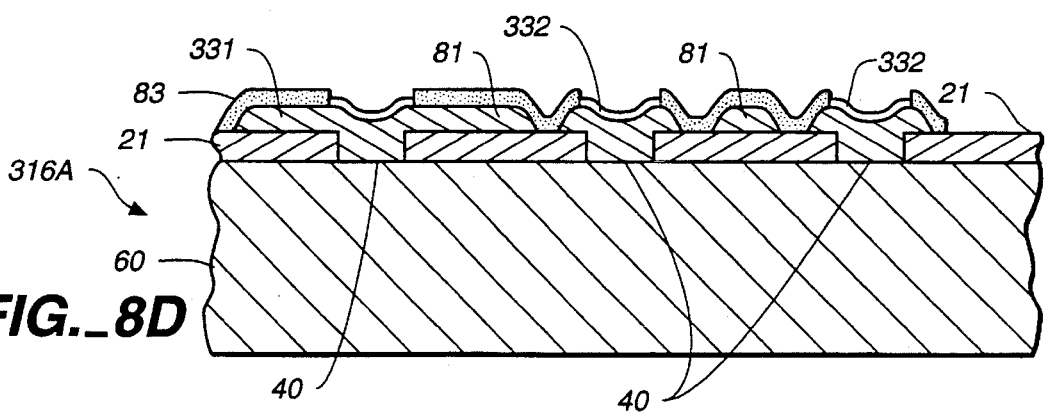
FIG._8D

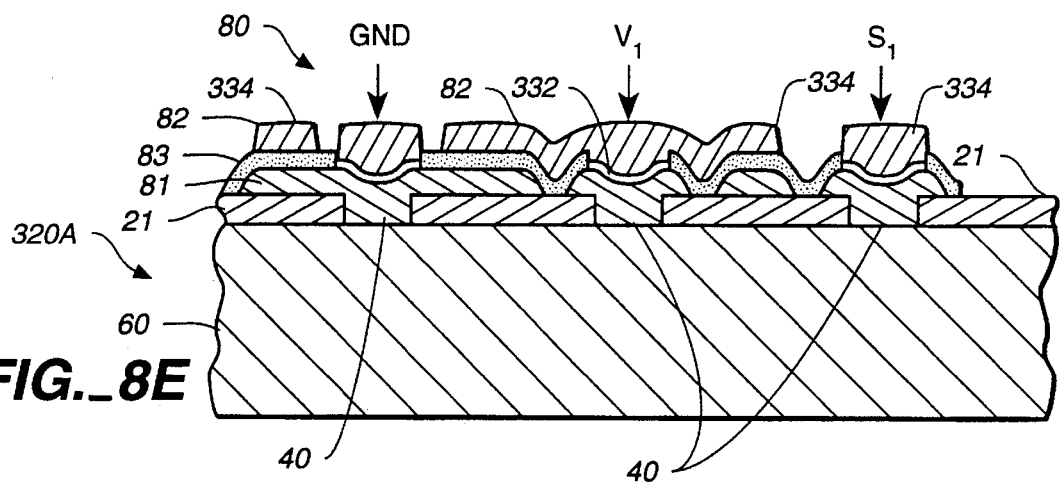
FIG._8E
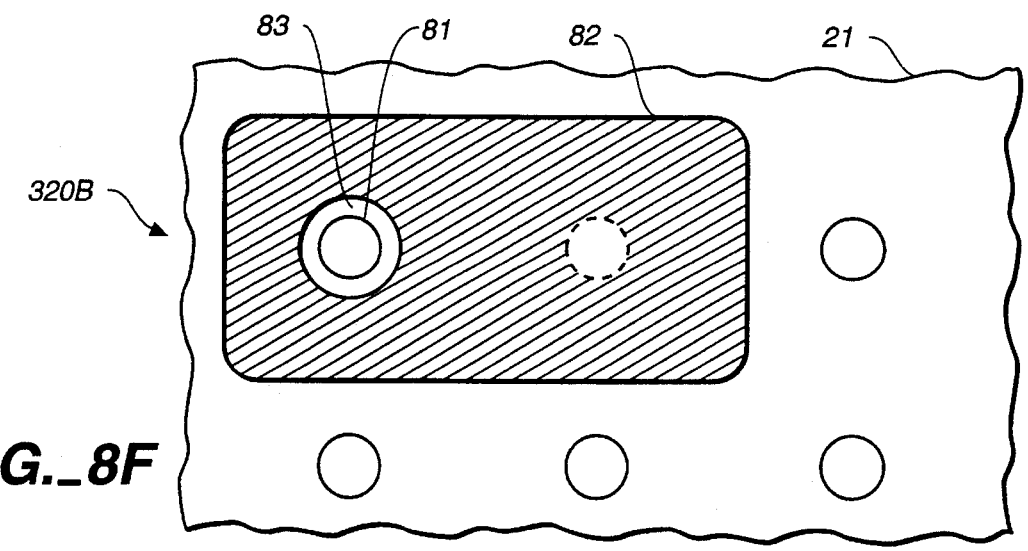
FIG._8F

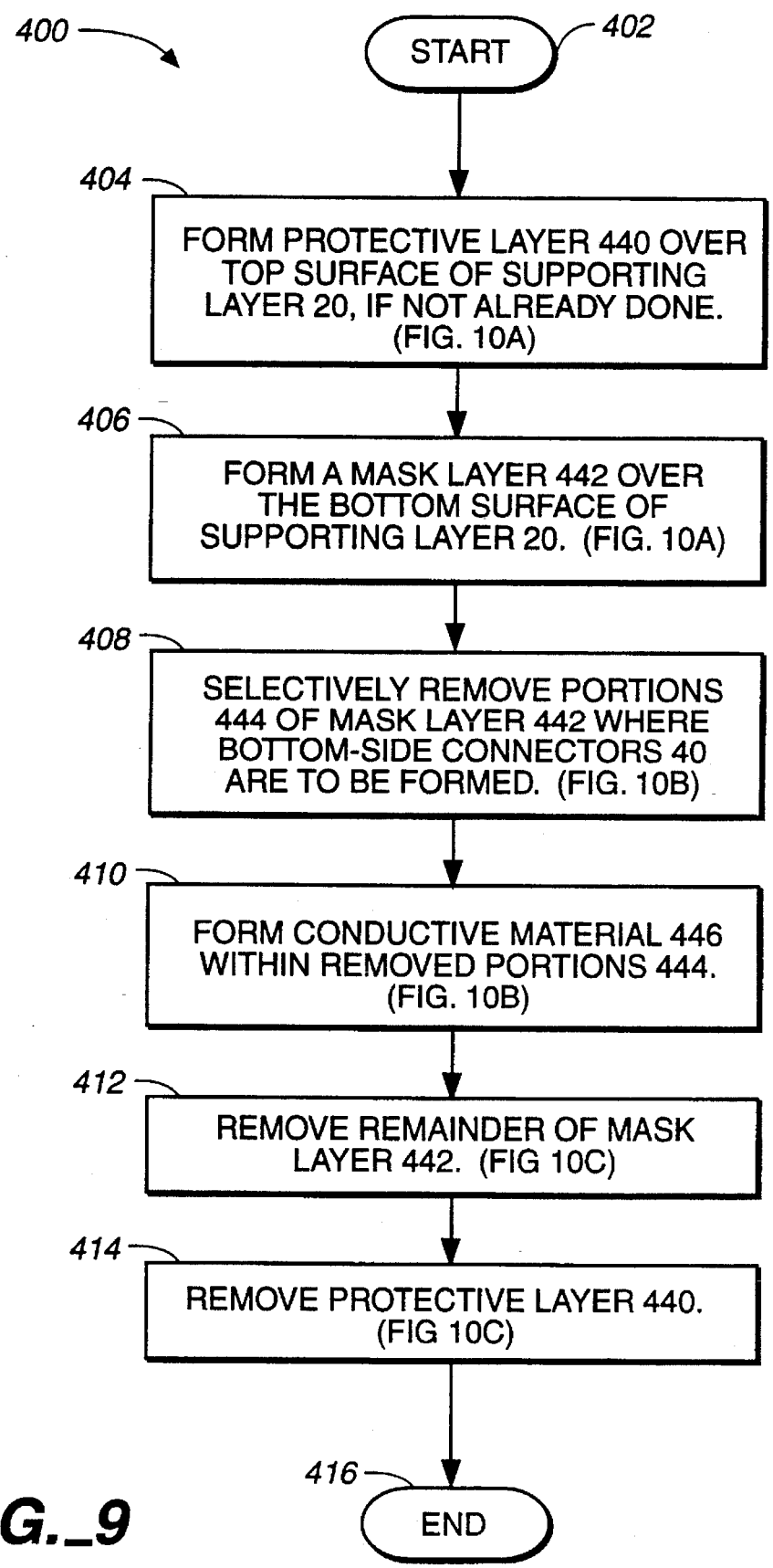
FIG._9

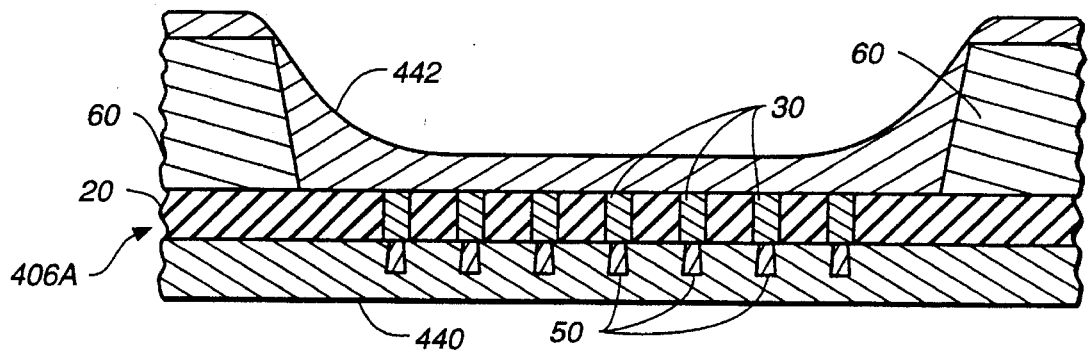
FIG._10A
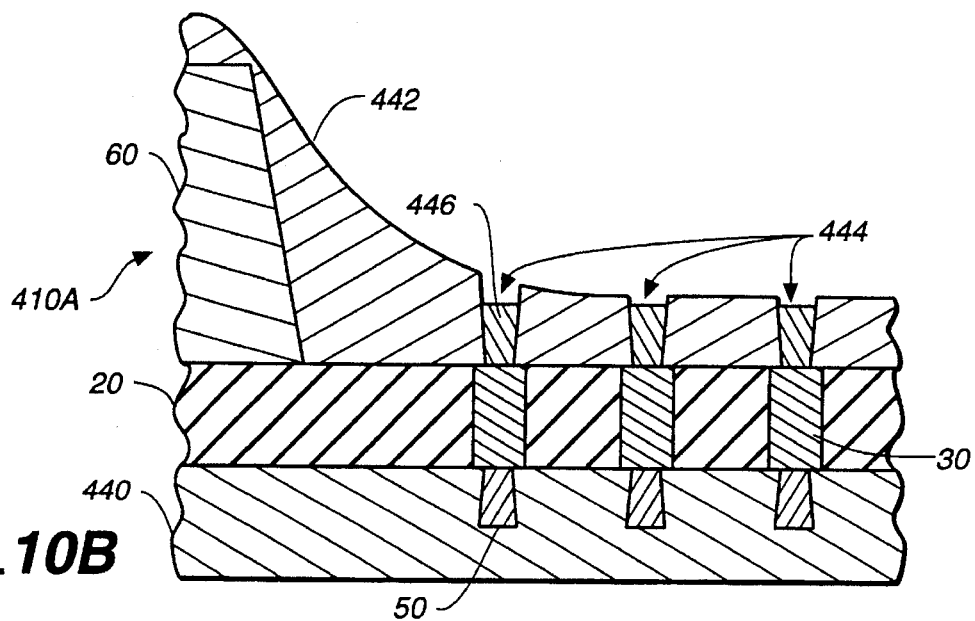
FIG._10B
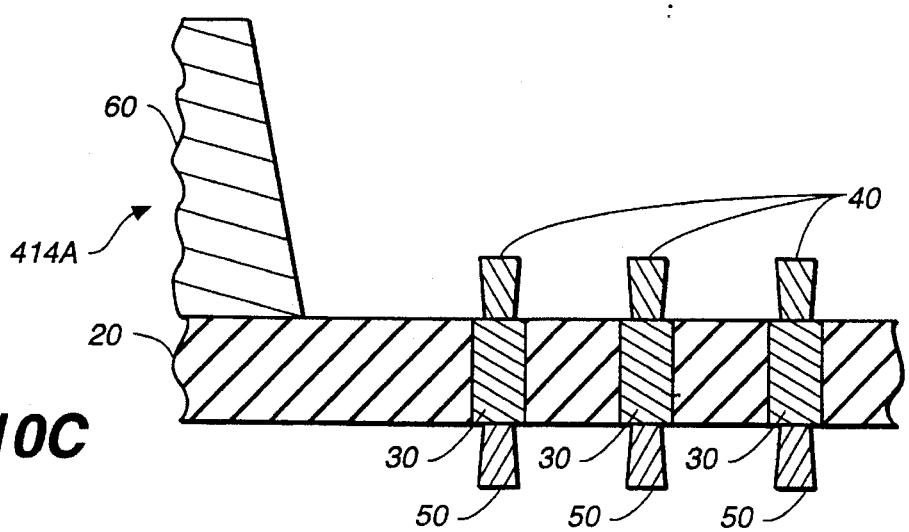
FIG._10C

INTERCONNECT CARRIERS HAVING HIGH-DENSITY VERTICAL CONNECTORS AND METHODS FOR MAKING THE SAME

FIELD OF THE INVENTION

The present invention relates to interconnect carriers and interposers for electrically coupling integrated circuit chips to supporting substrates. More specifically, the present invention relates to interconnect carriers having a high density of vertical connectors and methods for making the same.

BACKGROUND OF THE INVENTION

Various means of electrically and mechanically connecting, or coupling, an integrated circuit (IC) chip to a major substrate, are known. One means used for this purpose is to employ an intermediate substrate, sometimes called an interposer, positioned between the IC chip and the major substrate. Such interposers are generally used to provide a number of low-impedance paths for power and ground voltages to the IC chip from the major substrate, which cannot be achieved with wire bonds or lead frames. Optionally, a capacitor may be incorporated onto the interposer and coupled between a selected power line and ground to reduce the amount of noise generated on the power line due to simultaneous digital switching events occurring in the IC chip circuitry. Signal lines to the IC chip may be formed in the interposer, or may be provided by a lead frame or other suitable coupling means.

One type of interposer, as shown at 5 in FIG. 1 in a cross-sectional view, comprises a rigid substrate 6 (e.g., ceramic), a plurality of conductive vias 7 formed through substrate 6, a plurality of conductive pads 8 disposed on the interposer's top surface, each pad 8 positioned over a corresponding via 7, and a set of conductive pads 9 disposed on the interposer's bottom surface in a similar manner. Each via 7 and its corresponding pads 8 and 9 collectively form a vertical connector. The IC chip, shown at 1 in FIG. 1, has a plurality of pads 2 disposed on its active surface in corresponding relationship to pads 8 on the interposer's top surface. Likewise, the major substrate, shown at 3, has a plurality of pads 4 disposed on its surface in corresponding relationship to pads 9 on the interposer's bottom surface.

For electrical coupling, a plurality of solder bumps are typically disposed on the pads of either the IC chip or the interposer's top surface (or on both sets of pads). Likewise, a second plurality of solder bumps are typically disposed on the pads of either the major substrate or the interposer's bottom surface (or on both sets of pads). The interposer is then brought into alignment and initial contact with the IC chip and major substrate such that corresponding pads are aligned and separated by a corresponding solder bump. The solder bumps are then reflowed by heat to wet and make an adhesive and electrical contact with their corresponding pads. The reflow allows each solder bump to independently change its dimensions so at to compensate for any height variations which may be caused by warpage in the interposer's substrate, the IC chip, or the major substrate, or which may be caused by size variations in the solder bumps. For each of the interposer, IC chip, and major substrate, warpage may cause a 2 µm (micron) to 4 µm height difference between the high and low spots within a ~1.0 square centimeter area thereof. Accordingly, for a one centimeter square chip, there may be up to a 4 µm to 8 µm variation in the spacing between the interposer and the IC chip when they are brought into contact. The solder bumps are generally made large enough to compensate for such height variations.

The above-described type of interposer has a number of limitations which discourage its use for high-performance IC chips. First, such IC chips often consume large amounts of power, which raises the temperatures of the chips, causing their dimensions to expand. The thermally induced expansion generates mechanical stresses between the IC chip and the interposer and, as the interposer heats up, stresses between the interposer and the major substrate. These stresses may be sufficient to cause weak solder bumps to break away from their corresponding pads, resulting in a loss of electrical connection. Additionally, as the system undergoes thermal cycling, repeated stress can cause metal fatigue leading to failure of one or more of the bump/pad joints which couple the chip, interposer, and supporting substrate to one another. One prior art way of mitigating the mechanical stresses is to construct the interposer from a material which has a coefficient of thermal expansion (CTE) near that of the IC chip. However, mechanical stresses may still occur between the interposer and the chip each time the IC chip is "powered-up" if a large transient temperature difference develops between the IC chip and the interposer during start up. Additionally, a similar thermal transient may occur between the interposer and the major substrate.

In addition, because of its relatively large surface area, a typical high performance IC chip often has a large warpage across its active surface. If large enough, this warpage can prevent one or more solder bumps from contacting corresponding pads. The chance of contact failure increases as the combined warpage of the IC chip and interposer increases. Additionally, the combined warpages cause variations in the heights and widths of the solder bumps, which in turn causes the thermally-induced mechanical stresses to concentrate at a relatively small number of solder bumps, particularly those with low aspect ratios. This concentration increases the chance of a solder bump failing. Similar warpage effects occur for the interface between the interposer and major substrate. To minimize the warpage effects for both interfaces of the interposer, and thereby minimize the chances of a solder bump failure occurring at either of the interfaces, the interposer should have the smallest possible warpage. Unfortunately, with current manufacturing processes, the yield of interposers with low-warpage decreases as the size of interposers increases, thereby increasing the cost of manufacturing them.

The above-described type of interposer is generally limited in the density of bump/pad connections it may have, typically 100 to 400 per square centimeter. As circuit integration levels for IC chips increases, it is projected that interposers will need a higher density of interconnects, such as for example 2,000 to 10,000 per square centimeter. However, the risk of a bump failure occurring in response to thermally induced stress increases as the number of bumps (i.e., interconnects) increases.

Additionally, due to various limitations in processing the relative thick substrates of typical prior art interposers, the minimum diameter of vias of these interposers and the minimum separation between vias is generally limited to relatively large values. For example, current commercial ceramic processes can achieve, at best, a minimum via diameter of approximately 100 µm (4 mils) and a minimum center separation distance of approximately 150 µm (6 mils), which limits the maximum connector density to 4,400 per square centimeter. This interconnect density is less than the above projected density of 10,000.

To address some of the above-described limitations, other types of interposers using flexible substrates have been recently developed. These interposers generally have a flexible polymer film with a thickness of 250 μm–1000 μm or more, and plurality of through holes drilled, punched, or laser ablated through the film. In some such interposers, a short wire column, or pin, is inserted into each through hole; in others, a layer of metal is electroplated within each through hole. Unfortunately, these interposers have disadvantages associated with the flexible film. Specifically, because of its flexibility, the film often moves, twists, and stretches when being attached to the IC chip and major substrate. Accordingly, the film does not readily preserve the alignment of the through holes to the corresponding pads. To solve this problem, the areas of the pads and the spacing distance between through holes is increased, thereby decreasing the density of interconnects. Moreover, the pins used to fill the through holes sometimes fall out when the film is handled, or when the film is being positioned for contact. When drilling or punching are used to form the through holes, the minimum diameter of the through holes is limited to approximately 250 μm to 500 μm.

In addition to the above interconnect issues, many high performance IC chips require at least one power supply which can supply large transient currents, as for example caused by simultaneous switching of digital circuitry, without a significant change in the voltage it provides to the IC chip. One way of accommodating large transient currents is to couple a low inductance, high-value bypass capacitor between the power supply and a reference potential (e.g., ground), placing the bypass capacitor as close to the IC chip as possible. Many rigid, ceramic-substrate interposers incorporate bypass capacitors within their substrates. However, such a capacitor generally occupies a relatively large area, which would prevent the incorporation of many such capacitors on the same interposer unless more layers were added to the interposer, at a further cost, to distribute the capacitors over several layers. To the inventors' knowledge, many, if not all, flexible film interposers do not incorporate bypass capacitors. It is believed that the incorporation of bypass capacitors on such interposers would present major fabrication issues which the art has not heretofore addressed.

Accordingly, there is a need in the art to decrease the failure rate of interconnections of interposers due to thermally-induced mechanical stress and strain, and thereby increase the reliability of interposers and like devices.

There is a further need in the art for a cost effective method of minimizing the warpage of interposers, and of minimizing the deleterious effects caused by warpages in the IC chip, interposer, and major substrate.

There is a yet a further need in the art to increase the density of electrical interconnects of interposers and like devices.

There is a further need to have a high-value bypass capacitance integrated on the interposer, or interconnect structure, along with the large number of interconnects.

SUMMARY OF THE INVENTION

The interconnect carrier structure according to the present invention comprises a resilient supporting layer, a plurality of electrically conductive vias formed through the supporting layer and located within a selected area of the supporting layer, and an outer frame disposed around the periphery of the selected area and mechanically coupled to the supporting layer. The supporting layer preferably comprises an electrically insulating material and has sufficient flexibility to readily conform to the warpage of an IC chip or major substrate. The outer frame is more rigid, i.e., less flexible, than the supporting layer, having sufficient rigidity to prevent the supporting layer from readily folding, stretching or breaking during manufacturing, handling and assembly. The outer frame enables the supporting layer to have a thickness much smaller than prior art interposers, thereby enabling a much higher density of interconnects. Also, in a preferred embodiment, the outer frame comprises a coefficient of thermal expansion (CTE) near those of the IC chip and major substrate so that the frame may help adjust the surface dimensions of the supporting layer to follow thermally induced changes in the surface dimensions of the IC chip and major substrate.

The present invention also encompasses methods for constructing the foregoing interconnect carrier. One method according to the present invention comprises the steps of forming the resilient supporting layer over a top surface of a base substrate, forming a plurality of electrically conductive vias in the supporting layer, and removing the portion of the base substrate underlying the vias. The latter step exposes the bottom surface of the supporting layer which overlies the removed portion, and is performed in a way which forms the supporting frame. The method provides a stable platform need for the precision fabrication of the vias, the stable platform being removed after fabrication to leave the desired thin and flexible supporting layer.

Accordingly, it is an object of the present invention to provide an interconnect carrier for IC chips having high-density connectors.

It is another object of the present invention to provide an interconnect carrier for IC chips capable of conforming to the warpage of either the IC chip or the major substrate, or alternately conforming to a curved surface having a warpage intermediate to the warpages of the IC chip and major substrate.

It is another object of the present invention to provide interconnect carriers for IC chips capable of reducing mechanical stresses caused by temperature changes and thermal cycling.

It is yet another object of the present invention to provide an interconnect carrier for IC chips having large capacity bypass capacitors incorporated therein.

It is still another object of the present invention to provide methods for reliably constructing the interconnect carriers.

It is yet another object of the present invention to provide methods for readily constructing low-inductance, large-value bypass capacitors within the interconnect carriers and in close proximity to the connectors.

These and other objects of the present invention will become apparent to those skilled in the art from the following detailed description of the invention, the accompanying drawings, and the appended claims.

BRIEF DESCRIPTION OF THE DRAWINGS

FIG. 1 shows a cross-sectional view of an interposer according to the prior art.

FIG. 2 shows an isometric view of an interconnect carrier according to the present invention positioned in relation to an IC chip and a major substrate.

FIG. 3 shows a cross-sectional view of the interconnect carrier shown in FIG. 2 in contact relationship to the IC chip and the major substrate.

FIG. 4A shows a cross-sectional view of a second interconnect carrier according to the present invention positioned in relation to an IC chip and a major substrate.

FIG. 4B shows a cross-sectional view of a capacitor structure according to the present invention, shown as integrated on the interconnect carrier shown in FIG. 4A.

FIG. 5 shows a flow diagram of a method of forming interconnect carriers according to the present invention.

FIGS. 6A–6D show a sequence of cross-sectional views of an interconnect carrier according to the present invention at various stages of construction according to the flow diagram shown in FIG. 5.

FIG. 7 shows a flow diagram of a method of forming a capacitor structure according to the present invention.

FIGS. 8A–8E show a sequence of cross-sectional views of a capacitor structure according to the present invention at various stages of construction according to the flow diagram shown in FIG. 7, and FIG. 8F shows a top plan view thereof.

FIG. 9 shows a flow diagram of a method of forming a bottom-side surface connector according to the present invention.

FIGS. 10A–10C show a sequence of cross-sectional views of a set of bottom-side surface connectors according to the present invention at various stages of construction according to the flow diagram shown in FIG. 9.

DETAILED DESCRIPTION OF THE INVENTION

FIG. 2 shows an isometric view of an interconnect carrier 10 according to the present invention, which is positioned in relationship to an IC chip 1 and a major substrate 3. Interconnect carrier 10 comprises a resilient supporting layer 20 having sufficient flexibility to conform to the warpage of IC chip 1 or major substrate 3. In the preferred embodiments, the resiliency and flexibility of supporting layer 20 are provided by a small thickness and by the use of a material having high elasticity. Supporting layer 20 may comprise such materials as polyimide, stabilized photoresists, other polymeric materials, or other electrically insulating materials. In one embodiment, supporting layer 20 comprises polyimide and is relatively thin, having a thickness of less than approximately 250 µm. Since supporting layer 20 of the present invention is held within a frame, as described below, layer 20 need not provide structural support and thus may be made as thin as possible.

Interconnect carrier 10 further comprises a plurality of electrically conductive vias 30 disposed through supporting layer 20. VIA's 30 are located within a selected area 25 of supporting layer 20, and aligned to mate with corresponding pads 2 of IC chip 1, as well as to corresponding pads 4 of major substrate 3. In a preferred embodiment of interconnect carrier 10, an electrical coupling means, such as a solder bump, metallic mass, or a body of conductive elastomer, is interposed between each exposed side of each via 30 and its corresponding pads 2,4. The three components 1, 3, and 10, are aligned and contacted with one another, and the electrical coupling means are activated, e.g., by reflowing of the solder bumps.

Interconnect carrier 10 further comprises a supporting frame 64 joined to supporting layer 20 at the outer ends, or edges, thereof, and disposed around the periphery of selected area 25 which includes vias 30. In the embodiment shown in FIG. 2, frame 64 comprises an integral rectangle enclosing vias 30. However, in view of the teachings of the present invention, it will be apparent to those skilled in the art that frame 64 may comprise other shapes (e.g., circle, triangle, pentagon, etc.) or may have a shape which forms an open path (e.g., "U" shape, "V"-shape, etc.) around vias 30.

Frame 64 has sufficient rigidity to prevent supporting layer 20 from readily folding, stretching or breaking during manufacturing, handling and assembly. The rigidity of frame 64 may be provided by a large thickness relative to that of supporting layer 20, and/or by a material which has a lower elasticity (e.g., higher Young's modulus) than the material of supporting layer 20. In one embodiment, frame 64 comprises silicon or aluminum with a thickness of between 250 µm and 625 µm. With its greater rigidity, supporting frame 64 is capable of substantially maintaining the surface dimensions of the overall carrier, while supporting layer 20 remains flexible to conform to the warpages of IC chip 1 and major substrate 3.

According to the methods of the present invention described below, supporting layer 20 may be formed with a substantially uniform thickness and minimal warpage. In instances where frame 64 may be warped, as for example when formed from a warped wafer, supporting layer 20 is still capable of conforming to the warpages of IC chip 1 and major substrate 3 as it is capable of flexing between the inner area of frame 64 and selected area 25. The distance between the inner edge of frame 64 and vias 30 may be increased to increase the flexibility of supporting layer 20 in this regard.

In one embodiment of the present invention, frame 64 is oriented such that IC chip 1 fits within the inner area of frame 64, wherein vias 30 are located. However, it may be appreciated that major substrate 3 may be formed with a raised portion that can fit within the inner area of frame 64, and that frame 64 may be oriented such that frame 64 surrounds the raised portion of major substrate 3.

A cross-sectional view of interconnect carrier 10 in contact relationship to IC chip 1 and major substrate 3 is shown in FIG. 3. As an exemplary electrical coupling means, a plurality of solder bumps 15 are disposed on the surfaces of supporting layer 20, coupling vias 30 to corresponding pads 2 and 4. In one embodiment of interconnect carrier 10, a plurality of surface connectors 40 and 50 are included at the exposed ends of one or more vias 30. Surface connectors 40 are for contacting IC chip 1, and are referred to as bottom-side surface connectors, as these connectors are formed at the surface of layer 20 which is coupled to frame 64. (The terminology derives from the method of forming carrier 10 described below rather than the orientation of layer 20 in FIGS. 3 and 4). Surface connectors 50 are for contacting major substrate 3, and are referred to as top-side surface connectors. Each of surface connectors 40 and 50 may comprise a pad, as shown in FIG. 3, or a post structure, as shown in FIG. 4 depicting a second embodiment of the interconnect carrier according to the present invention. It may be appreciated that surface connectors 40 and 50 may comprise pads which limit the reflow of solder bumps 15 (e.g., ball limited metallization pads).

Interconnect carrier 10 may further comprise one or more capacitor structures 80, which may be used as bypass capacitance between adjacent power and ground lines. Capacitor structure 80 comprises a first conductive layer, or electrode, formed over a portion of one surface of supporting layer 20, a dielectric layer formed over a portion of the first conductive layer, and a second conductive layer formed over a portion of the dielectric layer. Each of the conductive layers is coupled to at least one via 30. The conductive layers and dielectric layer of the capacitor structure layer 80 are relatively thin in comparison to the thickness of supporting layer 20. These layers are shown in detail in the embodiments of the present invention shown in FIG. 4B. Capacitor 80 may, for example, be formed with a capacitance of approximately 20–200 nanofarads per square centimeter within a substantially rectangular area measuring between approximately 200 μm to 350 μm on a side.

A cross-section of a second embodiment of the interconnect carrier according to the present invention is shown at 100 in FIG. 4A. Carrier 100 comprises supporting layer 20, vias 30, supporting frame 64, and surface connectors 40 and 50. However, in contrast to carrier 10, a number of connectors 40 and 50 of carrier 100 comprise post structures rather than pads. Each post connector 40', 50' opposes a corresponding solder bump 15 and pad (2 or 4). Upon initial contact and reflow, solder bumps 15 reflow around the post connectors 40' and 50'. In one embodiment, the diameters of post connectors 40' and 50' are roughly equal to or less than the diameters of the corresponding solder bumps. Post connectors 40', 50' preferably comprise aspect ratios (height to minimum diameter) of more than approximately 0.5, and heights of more than 20 μm. The height provides a minimum stand-off distance between each of the carrier 100, chip 1, and major substrate 3. Post connectors 40' and 50' may have a height in the range of approximately 20 μm to approximately 60 μm, a diameter in the range of approximately 10 μm to approximately 30 μm, and an aspect ratio of more than approximately 2. Upon reflow, a solder bump 15 flows around a corresponding post connector, with solder solidifying in any gap between the post tip and the corresponding pad.

For each via 30, post connectors 40', 50' may be formed at both ends of the via 30, at just the end opposing IC chip 1, or at just the end opposing major substrate 3. For a via end not having a post connector, a post connector may be formed on the opposing component, either IC chip 1 or major substrate 3. The various post configurations are shown in FIG. 4A. A surface of supporting layer 20 may have all post connectors and no pad connectors (nor exposed via surfaces), or may have a mixture of post connectors and pad connectors (and/or exposed via surfaces). In a preferred embodiment of carrier 100, each surface of supporting layer 20 has substantially all of the same type surface connector formed over it.

A capacitor structure 80, integrated on interconnect carrier 100, is shown in FIG. 4B. Three vias, 30a, 30b, and 30c, are shown in FIG. 4B. As an example and without limiting the present invention, via 30a couples a signal line, via 30b couples a power line having a voltage $V_1$, and via 30c couples ground. Capacitor structure 80 comprises a first conductive layer 81, a second conductive layer 82, and a dielectric layer 83 formed between conductive layers 81 and 82. First conductive layer 81 is connected to via 30c, which couples the ground, and second conductive layer 82 is electrically coupled to via 30b, which couples $V_1$. Both conductive layers 81 and 82 are formed so as to not electrically contact via 30a, which couples a signal line, to either of vias 30b and 30c, or to other adjacent vias. A thin, flexible insulating guard layer 21, as shown in FIG. 4B, may be formed over supporting layer 20 to enclose first layer 81 within an insulating material. Methods for constructing capacitor structure 80 are discussed in greater detail below.

Each capacitor structure 80 is preferably spaced from adjacent capacitor structures 80 by at least approximately 5 μm, on each side thereof. The spacing enables supporting layer 20 to flex, enabling a large number of bypass capacitors to be included without substantially adversely affecting the flexibility or resilience of layer 20. Additionally, the total thickness of the capacitor layers may be made relatively thin (e.g., ~2 μm–6 μm) so that the capacitor structures may flex themselves.

The interconnect carriers according to the present invention have a number of advantages relative to prior art interposers. The combination of flexible and resilient supporting layer 20 and relatively rigid frame 64 enables the interposer to more readily conform to the warpages of the IC chip and supporting substrate, while outer frame 64 makes for easy handling while substantially preventing supporting layer 20 from folding, twisting, and/or stretching in a manner which would detrimentally affect alignment of the interconnects to connectors on IC chip 1 or major substrate 3. The positions of vias 30 are thereby substantially maintained while layer 20 may be flexed to conform to the warpages, as during the alignment of carriers 10 and 100 to IC chip 1 and major substrate 3.

Putting aside, for the moment, the issue of frame warpage, since supporting layer 20 is flexible and has a relatively uniform thickness, it effectively does not introduce a source of warpage. In a preferred method of assembly, each of carriers 10 and 100 is first attached to the IC chip and then to the major substrate. In doing so, supporting layer 20 substantially conforms to the warpage of the IC chip and transfers the warpage of the IC chip to its surface which confronts the major substrate. (Alternately, the carriers 10 and 100 may instead be first attached to the major substrate and then to the IC chip.) However, it may be appreciated that standard interposer attachment methods may be modified so as to enable the solder bumps to be reflowed simultaneously so that supporting layer 20 may adjust to average out the warpages of IC chip 1 and major substrate 3 (i.e., to conform to a theoretical surface which is an average of the chip and substrate warpages).

When frame 64 is warped, supporting layer 20 is capable of conforming to IC chip 1 (or major substrate 3), as long as the warpage in frame 64 is reasonable and as long as supporting layer 20 is sufficiently elastic and is not under too much tension. This capability is due to the flexibility of layer 20 in the region between the inner edges of frame 64 and the boundary of selected area 25. Because of this capability, the stringent warpage tolerances for rigid prior art interposers are not needed for frame 64. Accordingly, the warpage tolerance for useable flames 64 may be increased to increase the yield of useable carriers, thereby reducing manufacturing costs.

Additionally, the flexibility of supporting layer 20 reduces mechanical stresses caused by temperature changes and thermal cycling of the IC chip in a number of ways. As is known in the art, solder bumps (or post connectors) with low aspect ratios of height to diameter (e.g., less than 2) are more susceptible to fatigue and failure than high aspect ratio bumps (or post connectors). As also known in the art, warpages in the component substrates cause the solder bumps (or post connectors) disposed between the components to have variations in their aspect ratios, with mechanical stress being concentrated on the low-aspect ratio bumps. With layer 20 being attached to minimize the variations caused by warpages of IC chip 1 and major substrate 3 as described above, the variations in the aspect ratios may be reduced. Additionally, with layer 20 being flexible, vias 30 may move horizontally in response to thermally-induced stresses, and may tilt (i.e., pivot or rotate) from their normal positions.

Since each via 30 can tilt and move, the interconnect formed by each via with its corresponding connectors 40 and 50 and solder bumps 2 and 4 act substantially as a single member, capable of moving and tilting as a single unit in response to thermally-induced stresses. The action as a single member reduces the shear stresses at tile ends of tile interconnect in comparison to the case where via 30 is formed in a rigid substrate and cannot readily tilt. The reduction is due to the interconnect having an effective aspect ratio which is greater than the aspect ratios of its components. The effective aspect ratio is at least twice the aspect ratio of a solder bump or a post connector rigidly held by a ceramic substrate. As is known in the art, increasing the aspect ratio of an interconnect reduces the shear forces at its ends, and reduces the chances of fatigue and failure at its ends. Accordingly, the flexibility of supporting layer 20 reduces the fatigue and failure rates of interconnects in carriers 10 and 100 over the rigid interposers of the prior art.

As an additional advantage, high-density vertical connectors, e.g., vias 30 with connectors 40 and 50, may be formed on interconnect carriers according to the present invention. The relatively thin layer of supporting layer 20 enables small vias to be readily formed in close proximity to one another, thereby enabling the density of vias 30 to be increased. Additionally, the reduction in fatigue and failure rates due to the flexibility of supporting layer 20 enables the density of solder bumps to be increased.

Preferably, frame 64 comprises a coefficient of thermal expansion (CTE) near that of IC chip 1 and major substrate 3. Thus, frame 64 causes supporting layer 20 to change size in response to thermal changes substantially according to the CTE's of the IC chip and major substrate, rather than the CTE of supporting layer 20. The spacings between vias 30 would thereby be adjusted without vias 30 needing to apply substantial forces to layer 20, except perhaps during thermal transient conditions.

Methods for constructing interconnect carriers 10 and 100 are now described. FIG. 5 shows a flow diagram 200 for constructing supporting layer 20 with vias 30 and supporting frame 64, as found in each of interconnect carriers 10 and 100. A sequence of cross-sectional views of an interconnect carrier according to the present invention at various stages of construction according to flow diagram 200 is shown in FIGS. 6A–6D.

Flow diagram 200 begins at block 202 with a relatively thick base substrate 60, such as for example aluminum or silicon. In accordance with the method of the present invention, supporting frame 64 is formed from base substrate 60. A number of interconnect carriers 10, 100 may be formed together on substrate 60, and separated from one another after processing is complete.

At block 204, one or more capacitor structures 80 are optionally formed on the top surface of base substrate 60, if desired. This step includes the steps of forming conductive layers 81 and 82 for the capacitor electrodes of the structures 80 and the step of forming the dielectric layer 83 between the conductive layers 81 and 82. The capacitor layers are formed such that terminal connections to the capacitor electrodes are provided at the locations where selected vias 30 are to be formed and, optionally, where corresponding surface connectors 40 are to be formed. An exemplary flow diagram for forming capacitor layers 81–83 is shown in FIG. 7 and described more fully hereinbelow.

At block 206, as an optional step, a portion of base substrate 60 underlying the area where vias 30 are to be formed is partially removed, leaving a remaining portion of base substrate 60 underlying the area where vias 30 are to be formed. A partial cross-sectional view of base substrate 60 with the remaining portion is shown at 206A in FIG. 6A. The remaining portion of base substrate 60 is removed near the end of processing at block 214, preferably after supporting layer 20 and vias 30 have been formed. The pre-removal step (also call pre-thinning step) at block 206 decreases the overall costs of manufacturing interconnect carriers by culling out bad base substrates 60 early in the process flow. By performing the partial removal operation at block 206, a defective substrate can likely be discovered early in the process before completing the remaining processing steps, thus saving on overall costs. Moreover, the time required for performing the later removal step in block 214 is greatly reduced, thereby reducing the chance of the removal process (e.g., etching process) damaging supporting layer 20 or vias 30.

The partial removal operation at block 206 may include the following steps: forming a protective layer over the top surface of base substrate 60, forming a mask layer over the bottom surface of substrate 60 which exposes the portions which are to be partially etched, and exposing the bottom surface of substrate 60 to a suitable etchant. If base substrate 60 comprises aluminum, a suitable etchant may comprise a buffered solution of hydrochloric acid (HCl). If base substrate 60 comprises silicon, a suitable etchant may comprise a buffered solution of hydrofluoric acid (HF). After the portion is partially removed, the mask layer and protective layer are removed. Other removal processes, such as reactive ion etching and mechanical milling, may be used to partially remove the portion of base substrate 60. Mechanical milling is particularly suited to metallic and ceramic substrates. Additionally, the operation in block 206 may precede the operations in block 204, or may be performed later.

At block 208, supporting layer 20 is formed over the top surface of base substrate 60. In one embodiment of the present invention, the operation at block 208 comprises the steps of forming a polyimide layer over base substrate 60, as for example by spinning or spray coating, followed by curing the polyimide, as is known in the art. Polyimide is a non-conductive material and has a substantially larger elasticity than that of either aluminum or silicon. It may be appreciated that other polymeric materials, or other non-conductive material with sufficient elasticity at the thickness used, may be used in place of polyimide. With techniques well known in the art, supporting layer 20 may be formed with a substantially uniform thickness, ranging in value between approximately 20 µm to 200 µm. In one embodiment, supporting layer 20 is formed with a thickness of approximately 100 µm. The surface of layer 20 which contacts base substrate 60 is referred to as the bottom surface of layer 20, and the other surface is referred to as the top surface thereof. Bottom-side connectors 40, if formed, are formed at the bottom surface of layer 20, whereas top-side connectors 50, if formed, are formed at the top surface.

At block 210, conductive vias 30 are formed through supporting layer 20 at desired locations within selected area 25 of supporting layer 20. Block 210 preferably comprises the steps of removing portions of supporting layer 20 where vias 30 are to be formed, and then forming a conductive material within the removed portions. The removal of portions of supporting layer 20 may be accomplished by the steps of: forming a photoresist mask layer over the top of layer 20, exposing and developing the mask layer to form via patterns therein which expose the portions of layer 20 to be removed, and exposing layer 20 to a suitable etchant. Alternatively, supporting layer 20 may comprise a photosensitive polyimide material which need only be pattern exposed and developed, without the need of a photoresist mask layer.

Conductive material is preferably formed within the removed portions by electroplating. Alternatively, a selective chemical vapor deposition (CVD) process may be used or a conductive material may be sputtered or evaporated over the entire top surface of layer 20, then selectively removed by techniques well known in the art. Each via is formed with a surface substantially bonded to supporting layer 20, in contrast to the prior art methods of press fitting post columns within drilled holes of a polymeric substrate. A partial cross-sectional view of base substrate 60, supporting layer 20, and vias 30 after the processing of block 210 is shown at 210A in FIG. 6B. Due to the small size of capacitor 80 in relation to the sizes of supporting layer 20 and base substrate 60, only a simplified representation of the capacitor layers of structure 80 is shown in FIGS. 6A–6D.

If electroplating is used to form the conductive material within the removed portions of layer 20, a starting layer, or seed layer, of a compatible conductive material should be formed at the bottom of each removed portion where the vias 30 are to be formed. Such a starting layer may be provided by a conductive layer of a capacitor 80 formed at block 204. Alternatively, a suitable seed layer may be formed (e.g., sputtered) over the top surface of base substrate 60 before supporting layer 20 is formed thereon. A starting seed layer, if used, is later removed to electrically isolate each of vias 30 from one another.

At block 212, as an optional step, connectors 50 may be formed over the top surface of supporting layer 20. If connectors 50 comprise simple pads, they may be formed by depositing a metal layer over supporting layer 20, followed by etching the metal layer to leave the desired pads. Alternatively, if an electroplating process is used in prior block 210, the electroplating process may be continued to form small pad areas over vias 30. If surface connectors 50 comprise posts, the following steps may be used: depositing a relatively thick layer of photoresist over supporting layer 20, removing portions of the photoresist layer where the post connectors 50 are to be formed, followed by forming a conductive material within the removed portions of the photoresist. The conductive material may be formed as described above. The process for constructing post connectors 50 is described in greater detail below.

At block 214, the portion of base substrate 60 underlying vias 30 is removed to form supporting frame 64. Additionally any seed layer that was previously formed between base substrate 60 and supporting layer 20 is removed at block 214 to electrically isolate vias 30 from one another. A partial cross-sectional view of substrate 60, supporting layer 20, and vias 30 is shown at 214A in FIG. 6C. Preferably, the removed portion of base substrate 60 has a sufficient area to accommodate an IC chip.

At block 216, as an optional step, connectors 40 are formed upon the bottom surface of supporting layer 20. A process for forming bottom side connectors 40 is described in greater detail below. Returning to flow diagram 200, frame 64 is separated from base substrate 60 at block 218. This may be accomplished by a number of methods, such as saw dicing, laser dicing, etching, etc. As indicated above, a number of interconnect carriers according to the present invention may be formed with a single base substrate 60. Accordingly, the separation step may comprise separating a number of frames 64 from one another. A cross-sectional view of frame 64, supporting layer 20, and vias 30 is shown at 218A in FIG. 6D.

FIG. 7 shows a flow diagram 300 for constructing one or more capacitor structures 80 according to the present invention. A sequence of cross-sectional views of an interconnect carrier according to the present invention at various stages of constructing capacitor structure(s) 80 according to flow diagram 300 is shown in FIGS. 8A–8E.

Flow diagram 300 begins at block 302 with base substrate 60, as described above at block 204 of flow diagram 200 (see FIG. 5). At optional block 304, an insulating guard layer 21 is formed over base substrate 60, with portions thereof selectively removed where vias 30 are to be formed. In a subsequent step described below, a conductive material is formed within the removed portions to form bottom-side connectors 40 for vias 30. A cross-sectional view of base substrate 60 and guard layer 21 at the end of the processing in block 304 is shown at 304A in FIG. 8A.

At block 306, a conductive layer 331 is formed over substrate 60. In one embodiment, conductive layer 331 comprises a first relatively thin (e.g., 150 Å to 400 Å) layer of either chromium or titanium which provides adhesion to substrate 60, a second relatively thick (e.g., 2–6 µm thick) copper layer for low resistance, and a third relatively thin (e.g., 150 Å to 800 Å) layer of either chromium or titanium. However, it will be appreciated that other materials or layer compositions may be used. Layer 331 may be formed by well known deposition techniques, such as sputtering, evaporation, or CVD. If guard layer 21 has been optionally formed and patterned in block 304, conductive layer 331 fills the removed portions of guard layer 21 and thereby forms pad surface connectors 40 within the removed portions. At block 308, conductive layer 331 is patterned to form the first conductive layer(s) 81 of capacitor structure(s) 80, and to isolate bottom-side pad surface connectors 40 from one another if they had been previously formed. A cross-sectional view of substrate 60, surface connectors 40, and layers 21, 81, and 331 after the processing in block 308 is shown at 308A in FIG. 8B.

At blocks 310–316, insulating dielectric layers 83 are formed over corresponding conductive layers 81. This may be accomplished in a number of ways. In one embodiment of the present invention, each dielectric layer 83 comprises a high dielectric material, such as a metallic oxide, for example, an oxide of tantalum (Ta), aluminum (Al), titanium (Ti), or tungsten (W). These metal oxides may be formed by reactive sputtering, high temperature oxidation, or by sputtering followed by anodization curing. Alternatively, dielectric layer 83 may comprise other dielectric materials used in the semiconductor industry, such as polyimide, Sol-Gel, silicon dioxide, and silicon nitride.

Dielectric layer 83 is formed by an exemplary anodization process detailed in blocks 310–316. At block 310, a layer 332 of an anodizable material, such as for example tantalum, is formed over conductive layer 331. Layer 332 is formed by electroplating layer 332 onto layer 331. At block 312, masks 340 are formed over the locations where vias 30 are to be formed to prevent dielectric material from being formed during a subsequent anodization step. Masks 340 are formed by depositing a photoresist layer over the top surface of substrate 60 and patterning the photoresist layer to leave masks 340. A partial cross-sectional view of masks 340, in relation to substrate 60 and layers 21, 81, 331, 332, after the processing at block 312 is shown at 312A in FIG. 8C.

At block 314, the exposed portions of layer 332 are anodized in a suitable electrolytic solution. For this operation, base substrate 60 preferably comprises a suitably conductive material, such as aluminum or a suitably-doped silicon wafer. Dielectric layer 83 is formed to have a thickness ranging between 500 Å and 2,000 Å. Those portions of layer 332 underlying masks 340 are not anodized. At block 316, masks 340 are removed. A partial cross-section of substrate 60 with capacitor layers 81 and 83 at the end of processing in block 316 is shown at 316A in FIG. 8D.

As an alternative to the steps in blocks 310–316, an oxide of an anodizable metal, such as tantalum pentoxide ($Ta_2O_5$), may be deposited (e.g., by reactive sputtering) over the top surface of base substrate 60 (and thereby layer 331) and patterned by well known techniques.

At block 318, conductive layer 334 is formed over dielectric layer 83. In one embodiment, layer 334 consists primarily of copper sandwitched between optional adhesive layers, if necessary.

Second layer 334 is then patterned in block 320 to form capacitor electrode(s) 82 and to isolate surface connectors 40 from one another. The patterning comprises the steps of forming a photoresist layer over conductive layer 334, patterning the photoresist layer to expose regions of second layer 334 which are to be removed, and then removing those portions of layer 334. A cross-sectional view of a finished capacitor structure 80 after the processing in block 320 is shown at 320A in FIG. 8E. A top plan view thereof is shown at 320B in FIG. 8F.

FIG. 9 shows a flow diagram 400 for constructing bottom-side post connectors 40', as found in interconnect carrier 100. A sequence of cross-sectional views of an interconnect carrier according to the present invention at various stages of constructing post connectors 40' according to flow diagram 400 is shown in FIGS. 10A–10C. The selected steps from the methods described by flow diagram 700 may also be used to form top-side post connectors 50', as described below. If top-side post connectors 50' are to be formed, they are preferably formed before bottom-side post connectors 40' are formed.

Flow diagram 400 begins at block 402, which originates from block 216 of flow diagram 200 described above (see FIG. 5). At block 404, a protective layer 440 is formed over the top surface of supporting layer 20. Layer 440 is preferably formed prior to the removal of the portion of base substrate 60 underlying vias 30, as done in block 2 14 of flow diagram 200 shown in FIG. 5. Forming protective layer 440 before the portion of substrate 60 is removed enables layer 440 to be formed over a substantially rigid and planar surface, thereby simplifying the ability to obtain a substantially uniform thickness. Layer 440 may be formed before the removal of the base substrate portion in block 214 (FIG. 5) without impacting the removal process thereof. When wet etching is used to remove the base substrate portion, it is advantageous to deposit a protective layer on the top surface of layer 20 to protect it and vias 30 from the etchant solution.

At block 406, a mask layer 442 is formed over the exposed bottom surface of supporting layer 20. Mask layer 442 preferably comprises a photoresist material. A cross-sectional view of base substrate 60, layers 20, 440, and 442 at the end of processing in block 406 is shown at 406 in FIG. 10A. Due to the difference in heights between layer 20 and base substrate 60 at the backside of the interconnect carrier, there is a relatively large variation in the thickness of mask layer 442 in comparison to that which can be achieved when such mask layers are formed on substantially planar surfaces. However, as indicated below, the variation does not substantially affect the formation of post connectors 40 according to the present invention.

At block 408, a plurality of portions 444 of mask layer 442 are removed, each portion 444 corresponding to a location where a bottom-side post connector 40' is to be formed. Each removed portion 444 preferably exposes a corresponding via 30. Due to the difference in heights between layer 20 and base substrate 60 at the carrier backside, projection mask exposure is preferably used in exposing mask layer 442.

At block 410, a conductive material 446 is formed within the removed portions 444 to form post connectors 40'. Conductive material 446 is preferably formed by electroless electroplating, the exposed surfaces of vias 30 providing a suitable seed layer for the electroplating process. Although the thickness of mask layer 442 may vary, post connectors 40' are formed with substantially identical heights with the electroplating, as this process deposit material within removed portions 444 at a substantially uniform rate. A partial cross-sectional view of substrate 60, layer 442, removed portions 446, and conductive material 446 at the end of processing in block 410 is shown at 410A in FIG. 10B.

At block 412, the remaining portions of mask layer 442 are removed to expose post connectors 40'. At block 414, protective layer 440 is removed to expose post connectors 50'. A partial cross-sectional view of post connectors 40', vias 30, supporting layer 20, and substrate 60 at the end of processing in block 414 is shown at 414A in FIG. 10C.

As indicated above, selected steps from flow diagram 400 may be used to form top-side post connectors 50', if desired. Post connectors 50' are preferably formed before post connectors 40', and preferably before the portion of base substrate 60 underlying vias 30 is removed. Post connectors 50' may be formed by the steps of: (a) forming a mask layer (like layer 442) over the top surface of supporting layer 20; (b) selectively removing portions (like portions 444) of the mask layer where post connectors 50' are to be formed; and (c) forming conductive material within the removed portions. The mask layer may then be removed, or maintained to form part of protective layer 440 for the formation of bottom-side post connectors 40'.

With the methods described above, high density interconnect carriers may be readily and reliably constructed. Structures such as vias, pads connectors, post connectors, and capacitor structures are more easily and reliably constructed on thick rigid substrates rather than on thin flexible substrates. The use of base substrate 60 according to the methods of the present invention enables such structures to be easily and reliably constructed on layer 20 as the greater rigidity of substrate 60 provides rigidity to layer 20 and prevents it from being easily damaged or warped during processing. In turn, the rigidity provided to layer 20 enables vias 30 and surface connectors 50 to be readily and reliably constructed.

Moreover, as is known in the art, vias structures having small diameters (e.g., less than 100 µm) are more easily and reliably formed through thin layers, or substrates, than thick ones. Relatively costly and complicated processing steps requiring extraordinary control of processing parameters are needed to form small-diameter vias through thicker substrates. Additionally, the process complexity and the extraordinary control of parameters generally increase the chances of processing errors occurring and, consequently, the process yield degrading. In contrast, the relative thinness of layer 20 enables the construction of small-dimension vias 30, and hence enables vias to be constructed at high densities.

In comparison to ceramic green sheet manufacturing processes, the present invention may use more precise semiconductor manufacturing processes, thereby enabling smaller dimensions and high densities.

As stated above, an object of the present invention is to provide low-inductance, large-value bypass capacitors on the carriers in close proximity to vias and methods for ready construction thereof. As is known in the art, uniformly shrinking the dimensions of a via reduces the inductance of the structure. The relative thinness of supporting layer 20 enables the dimensions and inductance of each via 30 to be reduced. Additionally, the use of a relatively rigid base substrate in the above methods facilitate the construction of small via dimensions as well as the construction of high-valued dielectrics.

While the present invention has been particularly described with respect to the illustrated embodiments, it will be appreciated that various alterations, modifications and adaptations may be made based on tile present disclosure, and are intended to be within the scope of tile present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method for constructing an interconnect carrier having a surface capable of being connected to an integrated circuit chip, said method comprising the steps of:

(a) forming a resilient supporting layer over a top surface of a base substrate, said resilient supporting layer comprising an insulating material and having a top surface and a bottom surface, said bottom surface of said supporting layer overlaying the top surface of said base substrate;

(b) forming a plurality of electrically conductive via's in said supporting layer, each said via having conductive surfaces at the top and bottom surfaces of said supporting layer, said step including the steps of removing portions of said supporting layer at selected positions to form a plurality of voids and forming conductive material within each of said voids; and (c) removing a portion of said base substrate underlying said via's, said step exposing the bottom surface of said resilient supporting layer which underlies the removed portion and forming a supporting frame of said base substrate, said supporting frame having an inner edge and being attached to said supporting layer with its inner edge adjacent to the periphery of said selected area of said supporting layer such that an integrated circuit chip is capable of being fit within the inner edge of said frame and connected to said vias.

2. The method of claim 1 further comprising, prior to step (b), the step of partially removing, from the bottom surface of said base substrate, a first portion of said substrate underlying said selected area of said resilient supporting layer, said step leaving a second portion of said substrate having finite thickness underlying said vias, said second portion being later removed in step (c).

3. The method of claim 1 wherein said supporting layer comprises a material which has a greater elasticity than that of the material of said base substrate.

4. The method of claim 1 further comprising the step of forming a plurality of electrically-conductive surface connectors coupled to corresponding vias at the bottom surface of said supporting layer, said surface connectors being formed such that at least one said surface connector is electrically isolated from surrounding surface connectors.

5. The method of claim 4 wherein said step of forming said surface connectors at the bottom surface of said supporting layer comprises, subsequent to step (c) the steps of:

(d) forming a mask layer over the exposed portions of said supporting layer's bottom surface;

(e) removing portions of said mask layer where said surface connectors are to be formed; and (f) forming a conductive material within said removed portions.

6. The method of claim 5 further comprising, before step (d), the step of forming a protective layer over the top surface of said supporting layer.

7. The method of claim 6 wherein said protective layer is formed prior to removing the portion of said base substrate underlying said vias in step (c).

8. The method of claim 5 wherein said step (f) comprises the step of electroplating said conductive material within said removed portions.

9. The method of claim 4 wherein said step of forming said surface connectors at the bottom surface of said supporting layer comprises, prior to step (b) the steps of:

(d) forming a flexible insulating guard layer over the top surface of said base substrate;

(e) removing portions of said guard layer wherein said connectors are to be formed; and (f) forming a conductive material within said removed portions to form said connectors.

10. The method of claim 9 wherein said step (f) comprises the steps of forming a layer of conductive material over said guard layer and the exposed portions of base substrate underlying the removed portions of said guard layer, and removing portions of said conductive material layer to electrically isolate at least one said connector from adjacent connectors.

11. The method of claim 1 further comprising forming a capacitor structure on a selected area on the top surface of said base substrate, said capacitor structure comprising a first conductive layer, a dielectric layer formed over a portion of said first conductive layer, and a second conductive layer formed over a portion of said dielectric layer, at least one of said vias formed in step (b) subsequently being formed to electrically couple to said first conductive layer, and at least another of said vias formed in step (b) subsequently being formed to electrically couple to said second conductive layer.

12. The method of claim 11 wherein said step of forming a capacitor structure comprises the steps of: forming said first conductive layer on the top surface of said base substrate such that a portion of the top surface of said first conductive layer comprises an anodizable conductive material; anodizing a portion of said anodizable material to form said dielectric layer; and forming said second conductive layer over said anodized dielectric layer.

13. The method of claim 12 wherein said step of forming said first conductive layer comprises the steps of: depositing a layer of conductive metal on the top surface of said base substrate; removing selected portions of the conductive metal layer to form said first conductive layer of said capacitor structure; and forming a layer of said anodizable conductive material over a portion of said first conductive layer.

14. The method of claim 13 wherein the step of forming said second conductive layer comprises the steps of depositing a layer of conductive metal on the top surface of said base substrate and removing portions of the conductive metal to form said second conductive layer.

15. The method of claim 14 further comprising the step of forming a plurality of electrically-conductive surface connectors coupled to corresponding vias at the bottom surface of said supporting layer, at least two of said surface connectors being formed to also couple said first and second conductive layers, respectively, of said capacitor structure.

16. The method of claim 1 further comprising the step of forming a plurality of electrically conductive surface connectors electrically coupled to corresponding vias at the top surface of said supporting layer.

17. The method of claim 16 wherein said step of forming said surface connectors comprises the steps of: forming a mask layer over said vias; removing portions of said mask layer where said surface connectors are to be formed and such that said removed portions expose surfaces of said vias; and forming a conductive layer within said removed portions.

18. The method of claim 17 wherein said step of forming a conductive material within said removed portions comprises electroplating said conductive material.

19. An interconnect carrier having a surface capable of being connected to an integrated circuit chip, comprising:

a resilient supporting layer comprising an insulating material and having first and second surfaces;

a plurality of electrically conductive via's formed through the surfaces of said supporting layer and located within a selected area of said supporting layer, said selected area having a periphery, and a supporting frame having an inner edge, said frame being attached to said supporting layer with its inner edge adjacent to the periphery of said selected area of said supporting layer so that an integrated circuit chip is capable of being fit within the inner edge of said frame and connected to said vias.

20. The interconnect structure of claim 19 wherein each said via is formed with a surface substantially bonded to said supporting layer.

21. The interconnect structure of claim 19 wherein said supporting layer has a thickness less than approximately 250 μm.

22. The interconnect structure of claim 19 further comprising a capacitor structure formed within said supporting layer, said capacitor structure having a first conductive layer electrically coupled to at least one via and a second conductive layer electrically coupled to at least one other via.

23. The interconnect structure of claim 19 further comprising a first plurality of electrically conductive surface connectors disposed on one surface of said supporting layer, each said surface connector being electrically coupled to a corresponding via.

24. The interconnect structure of claim 23 wherein each of said first surface connectors has an aspect ratio of more than 0.5.

25. The interconnect structure of claim 23 wherein each of said first surface connectors has a height of more than 20 micrometers.

26. The interconnect structure of claim 23 further comprising a second plurality of electrically conductive surface connectors disposed on the other surface of said supporting layer, each said surface connector being electrically coupled to a corresponding via.

27. The carrier of claim 19 wherein said inner edge defines at least an open path around said selected area of said supporting layer.

28. The carrier of claim 27 wherein said inner edge defines a closed path around said selected area of said supporting layer.

29. The carrier of claim 19 wherein said inner edge defines an aperture in said supporting frame.

30. The carrier of claim 19 wherein said inner edge substantially lies in a plane which is co-planar with said supporting layer.

31. The carrier of claim 19 wherein said supporting frame is more rigid than said supporting layer.

32. An interconnect carrier having a surface capable of being connected to an integrated circuit chip, comprising:

a resilient supporting layer comprising an insulating material and having first and second surfaces;

a plurality of electrically conductive via's formed through the surfaces of said supporting layer and located within a selected area of said supporting layer, said selected area having a periphery lying in the plane of said supporting layer; and a supporting frame attached to said supporting layer around a substantial portion of the periphery of said selected area such that each surface of said selected area is left exposed by said frame so that an integrated chip is capable of being connected to the vias thereat.

33. The carrier of claim 32 wherein said supporting frame is more rigid than said supporting layer.

* * * * *

UNITED STATES PATENT AND TRADEMARK OFFICE
CERTIFICATE OF CORRECTION

PATENT NO. : 5,474,458
DATED : December 12, 1995
INVENTOR(S) : Habib Vafi, et al.

It is certified that error appears in the above-indentified patent and that said Letters Patent is hereby corrected as shown below:

Column 1, line 48, "interposer' stop" should read --interposer's top--.

Column 3, line 51, "is a yet a" should read --is yet a--.

Column 4, line 26, "need" should read --needed--.

Column 8, line 55, "As also" should read --As is also--.

Column 9, line 5, "tile" should read --the--.

Column 9, line 5, "tile" should read --the--.

Column 11, line 66, "flames" should read --frames--.

Column 13, line 45, "21 4" should read --214--.

Column 14, line 17, "deposit" should read --deposits--.

Column 14, line 56, "vias" should read --via--.

UNITED STATES PATENT AND TRADEMARK OFFICE
CERTIFICATE OF CORRECTION

PATENT NO. : 5,474,458
DATED : December 12, 1995
INVENTOR(S) : Habib Vafi, et al.

It is certified that error appears in the above-indentified patent and that said Letters Patent is hereby corrected as shown below:

Col. 15  Claim 1, line 10, "via's" should read --vias--.

Col. 15  Claim 1, line 18, "via's" should read --vias--.

Col. 17  Claim 19, line 5, "via's" should read --vias--.

Col. 18  Claim 32, line 5, "via's" should read --vias--.

Signed and Sealed this

Twenty-second Day of October, 1996

Attest:

BRUCE LEHMAN

*Attesting Officer*       *Commissioner of Patents and Trademarks*